United States Patent
Cho et al.

(10) Patent No.: US 9,208,947 B2
(45) Date of Patent: Dec. 8, 2015

(54) MULTILAYER CERAMIC CAPACITOR AND BOARD HAVING MULTILAYER CERAMIC CAPACITOR EMBEDDED THEREIN

(71) Applicant: Samsung Electro-Mechanics Co., Ltd., Suwon, Gyunggi-Do (KR)

(72) Inventors: Dong Su Cho, Gyunggi-Do (KR); Hyun Woo Kim, Gyunggi-Do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 195 days.

(21) Appl. No.: 14/086,962

(22) Filed: Nov. 21, 2013

(65) Prior Publication Data
US 2015/0068792 A1    Mar. 12, 2015

(30) Foreign Application Priority Data
Sep. 9, 2013   (KR) .................. 10-2013-0108102

(51) Int. Cl.
| | |
|---|---|
| H01G 4/06 | (2006.01) |
| H01G 4/12 | (2006.01) |
| H01G 4/30 | (2006.01) |
| H01G 2/06 | (2006.01) |
| H05K 1/18 | (2006.01) |

(52) U.S. Cl.
CPC . H01G 4/12 (2013.01); H01G 2/06 (2013.01); H01G 4/30 (2013.01); H05K 1/185 (2013.01); H05K 2201/10015 (2013.01); H05K 2201/10636 (2013.01)

(58) Field of Classification Search
CPC ............. H01G 4/12; H01G 4/06; H01G 4/30; H01G 4/232; H05K 1/162; H05K 3/46
USPC .............. 174/258, 260; 361/301.4, 311
See application file for complete search history.

(56) References Cited

U.S. PATENT DOCUMENTS

| | | | |
|---|---|---|---|
| 2006/0215349 A1 | 9/2006 | Lee et al. | |
| 2009/0139757 A1* | 6/2009 | Lee et al. | 174/260 |
| 2012/0134068 A1* | 5/2012 | Chae et al. | 361/321.2 |
| 2013/0083448 A1* | 4/2013 | Chung et al. | 361/301.3 |
| 2013/0242462 A1* | 9/2013 | Kawano et al. | 361/321.1 |

FOREIGN PATENT DOCUMENTS

| | | |
|---|---|---|
| JP | 2006-351819 A | 12/2006 |
| KR | 10-0586962 B1 | 6/2006 |
| KR | 10-0593930 B1 | 6/2006 |
| KR | 10-2006-0102572 A | 9/2006 |

* cited by examiner

*Primary Examiner* — Timothy Thompson
*Assistant Examiner* — Guillermo Egoavil
(74) *Attorney, Agent, or Firm* — McDermott Will & Emery LLP

(57) ABSTRACT

There is provided a multilayer ceramic capacitor, including a ceramic body including a plurality of dielectric layers stacked in a width direction and having upper and lower surface, first and second side surfaces, and first and second end surfaces, a first internal electrode formed on the dielectric layer and including a first lead part exposed to the upper and lower surfaces, a second internal electrode facing the first internal electrode, having at least one dielectric layer therebetween and having a second lead part exposed to the upper and lower surfaces, a first external electrode, a second external electrode, a first dummy pattern, and a second dummy pattern, wherein when a length of the ceramic body is B, a distance of the first lead part is C1, and a distance of the first dummy pattern is C3, $0.1 \leq (C1+C3)/B \leq 0.6$ is satisfied.

15 Claims, 4 Drawing Sheets

MULTILAYER CERAMIC CAPACITOR AND BOARD HAVING MULTILAYER CERAMIC CAPACITOR EMBEDDED THEREIN

CROSS-REFERENCE TO RELATED APPLICATION

This application claims the benefit of Korean Patent Application No. 10-2013-0108102 filed on Sep. 9, 2013, with the Korean Intellectual Property Office, the disclosure of which is incorporated herein by reference.

BACKGROUND

The present disclosure relates to a multilayer ceramic capacitor and a board having a multilayer ceramic capacitor embedded therein.

Generally, electronic components using a ceramic material, such as capacitors, inductors, piezoelectric elements, varistors, or thermistors, or the like, include a ceramic body formed of a ceramic material, internal electrodes formed in the ceramic body, and external electrodes mounted on a surface of the ceramic body so as to be connected to the internal electrodes.

Among the ceramic electronic components, a multilayer ceramic capacitor includes a plurality of stacked dielectric layers, internal electrodes disposed so as to face each other, having one dielectric layer therebetween, and external electrodes electrically connected to the internal electrodes.

The multilayer ceramic capacitors have been widely used as components for computers, mobile communications devices such as personal digital assistances (PDAs), mobile phones, or the like, due to advantages such as a small size, high capacitance, easiness of mounting, or the like.

Recently, as electronic products are miniaturized and multi-functionalized, chip components also tend to be miniaturized and multi-functionalized. As a result, there is a need to miniaturize a size of the multilayer ceramic capacitor, increase the capacitance thereof, and have high reliability.

RELATED ART DOCUMENT

Korean Patent No. 10-0586962
Japanese Patent Laid-Open Publication No. 2006-351819

SUMMARY

An aspect of the present disclosure may provide a multilayer ceramic capacitor having high capacitance and not causing a short-circuit, and a board having a multilayer ceramic capacitor embedded therein.

According to an aspect of the present disclosure, a multilayer ceramic capacitor may include: a ceramic body including a plurality of dielectric layers stacked in a width direction and having upper and lower surface opposing each other in a thickness direction, first and second side surfaces opposing each other in the width direction, and first and second end surfaces opposing each other in a length direction; a first internal electrode formed on the dielectric layer in the ceramic body and including a first lead part extended to be exposed to the upper and lower surfaces of the ceramic body; a second internal electrode disposed to face the first internal electrode, having at least one dielectric layer of the plurality of dielectric layers therebetween and having a second lead part extended to be exposed to the upper and lower surfaces of the ceramic body; a first external electrode connected to the first internal electrode; a second external electrode connected to the second internal electrode; a first dummy pattern connected to the second external electrode; and a second dummy pattern connected to the first external electrode, wherein, in the case that a length of the ceramic body is B, a distance of the first lead part exposed to the upper surface of the ceramic body is $C_1$, and a distance of the first dummy pattern exposed to the upper surface of the ceramic body is $C_3$, $0.1 \le (C_1+C_3)/B \le 0.6$ is satisfied.

In the case that a distance of the second lead part exposed to the upper surface of the ceramic body is $C_2$ and a distance of the second dummy pattern exposed to the upper surface of the ceramic body is $C_4$, $0.1 \le (C_2+C_4)/B \le 0.6$ may be satisfied.

The first dummy pattern may be formed on a dielectric layer having the first internal electrode formed thereon among the plurality of dielectric layers, and the second dummy pattern may be formed on a dielectric layer having the second internal electrode formed thereon among the plurality of dielectric layers.

The first dummy pattern and the first internal electrode may be disposed on one surface of the dielectric layer, and the second dummy pattern and the second internal electrode may be disposed on the other surface of the dielectric layer.

The first dummy pattern may have a region overlapped with the second lead part, and the second dummy pattern may have a region overlapped with the first lead part.

The first lead part may be exposed to the upper and lower surfaces and the first end surface of the ceramic body.

The second lead part may be exposed to the upper and lower surfaces and the second end surface of the ceramic body.

The first dummy pattern may be exposed to the upper and lower surfaces and the second end surface of the ceramic body.

The second dummy pattern may be exposed to the upper and lower surfaces and the first end surface of the ceramic body.

The first dummy pattern may be formed so as to enclose an end portion of the first internal electrode opposing the first dummy pattern while having a predetermined interval therebetween.

The ceramic body may have a thickness less than a width and a length.

The first internal electrode and the second internal electrode may be disposed so as to be perpendicular to the upper and lower surfaces of the ceramic body.

The first internal electrode and the second internal electrode may be disposed to be perpendicular to a board when being embedded in the board.

According to another aspect of the present disclosure, a board having a multilayer ceramic capacitor embedded therein may include: an insulation substrate; and a multilayer ceramic capacitor including a ceramic body including a plurality of dielectric layers stacked in a width direction and having upper and lower surface opposing each other in a thickness direction, first and second side surfaces opposing each other in the width direction and first and second end surfaces opposing each other in a length direction, a first internal electrode formed on the dielectric layer in the ceramic body and including a first lead part extended to be exposed to the upper and lower surfaces of the ceramic body, a second internal electrode disposed to face the first internal electrode, having at least one dielectric layer of the plurality of dielectric layers therebetween and having a second lead part extended to be exposed to the upper and lower surfaces of the ceramic body, a first external electrode connected to the first internal electrode, a second external electrode connected to the second internal electrode, a first dummy pattern connected to the second external electrode, and a second dummy pattern connected to the first external electrode, and satisfying $0.1 \leq (C1+C3)/B \leq 0.6$ in the case that a length of the ceramic body is B, a distance of the first lead part is C1, and a distance of the first dummy pattern is C3.

The first internal electrode and the second internal electrode may be disposed so as to be perpendicular to the insulation substrate.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
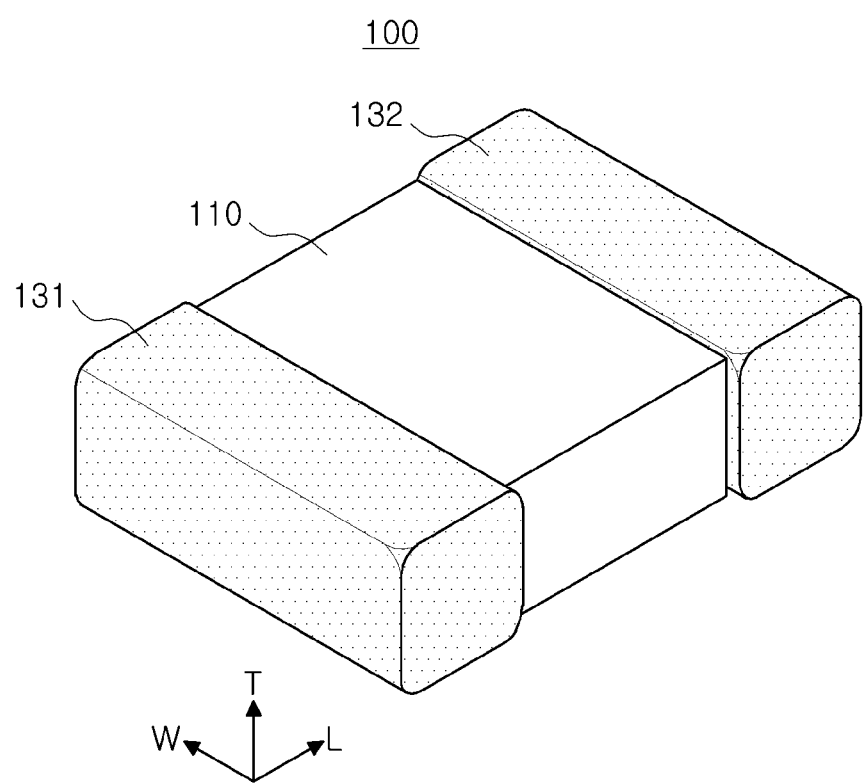
FIG. 1 is a perspective view schematically showing a multilayer ceramic capacitor according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Capacitor 100

According to an exemplary embodiment of the present disclosure, there may be provided a multilayer ceramic capacitor 100 including a ceramic body 110 including a plurality of dielectric layers 111 stacked in a width direction and having upper and lower surface opposing each other in a thickness direction, first and second side surfaces opposing each other in the width direction and first and second end surfaces opposing each other in a length direction; a first internal electrode 121 formed on the dielectric layer 111 in the ceramic body and including a first lead part 121a extended to the upper and lower surfaces of the ceramic body so as to be exposed thereto; a second internal electrode 122 disposed so as to face the first internal electrode 121, having at least one dielectric layer of the plurality of dielectric layers 111 therebetween and having a second lead part 122a extended to the upper and lower surfaces of the ceramic body so as to be exposed thereto; a first external electrode 131 connected to the first internal electrode 121; a second external electrode 132 connected to the second internal electrode 122; a first dummy pattern 123 connected to the second external electrode 132; and a second dummy pattern 124 connected to the first external electrode 131, where, in the case that a length of the ceramic body is B, a distance of the first lead part 121a exposed to the upper surface of the ceramic body is C1, and a distance of the first dummy pattern 123 exposed to the upper surface of the ceramic body is C3, $0.1 \leq (C1+C3)/B \leq 0.6$ is satisfied.

The present exemplary embodiment will now be described in detail with reference to the accompanying drawings.

FIG. 1 is a perspective view schematically showing a multilayer ceramic capacitor according to an exemplary embodiment of the present disclosure.

Figure 2:
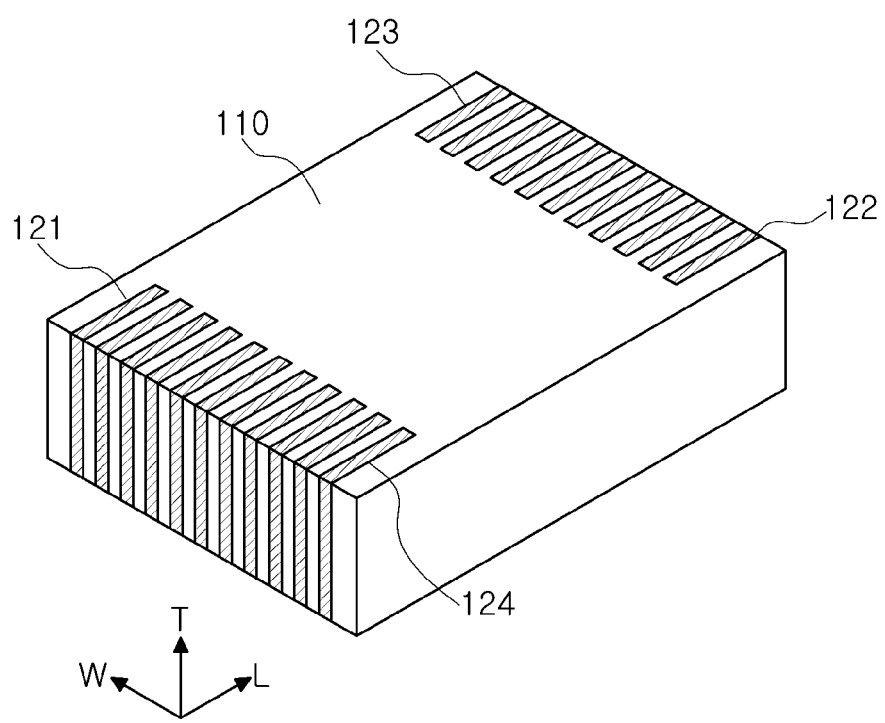
FIG. 2 is a perspective view schematically showing a ceramic body of the multilayer ceramic capacitor according to the exemplary embodiment of the present disclosure.

FIG. 2 is a perspective view schematically showing a ceramic body of the multilayer ceramic capacitor according to the exemplary embodiment of the present disclosure.

Referring to FIG. 1, the multilayer ceramic capacitor according to the present exemplary embodiment may include a ceramic body 110; a first external electrode 131, and a second external electrode 132.

Referring to FIG. 2, the ceramic body 110 may have upper and lower surfaces opposing each other in a thickness direction, first and second side surfaces opposing each other in a width direction and connecting the upper and lower surfaces to each other, and first and second end surfaces opposing each other in a length direction and connecting the upper and lower surfaces to each other.

In the multilayer ceramic capacitor according to the exemplary embodiment of the present disclosure, a 'length direction' is defined as an 'L' direction of FIG. 1, a 'width direction' is defined as a 'W' direction of FIG. 1, and a 'thickness direction' is defined as a 'T' direction of FIG. 1. Here, the 'width direction' may be the same direction as a direction in which dielectric layers are stacked, a 'stacking direction'.

A shape of the ceramic body 110 is not particularly limited, but may be formed in a hexahedral shape as shown FIGS. 1 and 2. Although the ceramic body 110 does not have a hexahedral shape having a perfect straight line due to sintering shrinkage of a ceramic powder at the time of sintering a chip and a polishing process after the sintering process, the ceramic body 110 may have a substantially hexahedral shape.

In the case in which the ceramic body 110 is embedded in a board, the upper and lower surfaces opposing each other in the thickness direction of the ceramic body may be disposed so as to be parallel with the board.

The ceramic body 110 may have a thickness of 250 μm or less. The thickness of the ceramic body 110 may be a distance between the upper and lower surfaces.

In the case in which the ceramic body 110 may have a thickness of 250 μm or less as mentioned above, the ceramic body may be suitable for the multilayer ceramic capacitor embedded in the board.

Further, the ceramic body 110 may have the thickness less than a width and a length so as to be easily embedded in the board. For example, the ceramic body 110 may have a hexahedral shape having a relatively reduced thickness.

Figure 3:
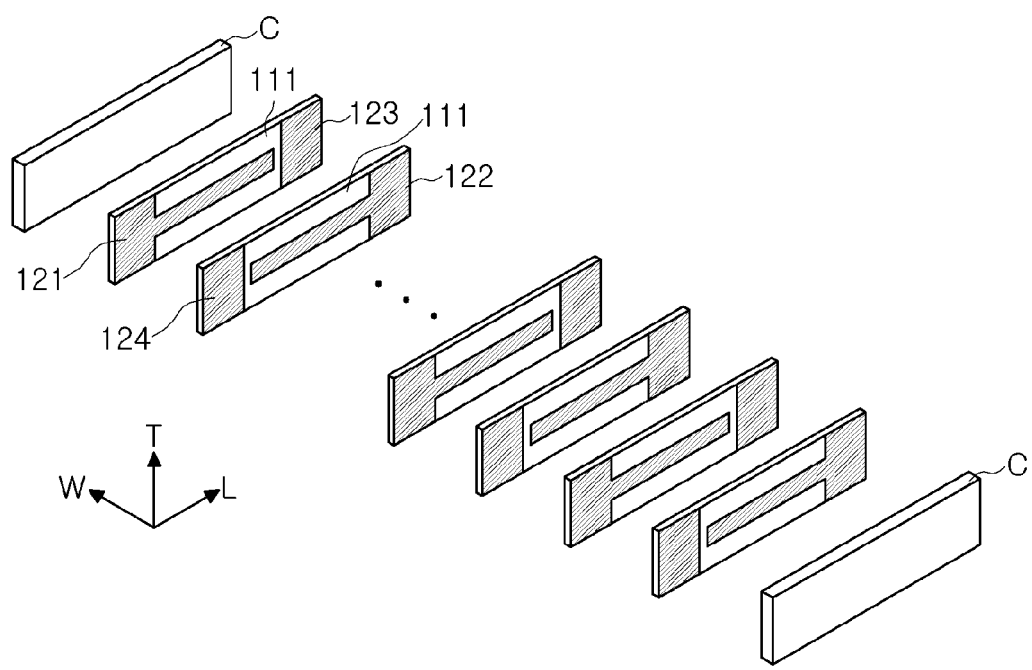
FIG. 3 is an exploded perspective view of the ceramic body of the multilayer ceramic capacitor according to the exemplary embodiment of the present disclosure.

As shown in FIG. 3, an exploded perspective view of the ceramic body, the ceramic body 110 may include a plurality of dielectric layers 111, and first and second internal electrodes 121 and 122 and first and second dummy patterns 123 and 124 formed on the dielectric layer 111, and may be formed by stacking the plurality of dielectric layers having the internal electrodes and the dummy patterns formed thereon. In addition, the first and second internal electrodes 121 and 122 may be disposed so as to face each other, having one dielectric layer 111 therebetween.

Since the dielectric layers 111 are stacked in the width direction of the ceramic body, the internal electrodes 121 and 122 may also be stacked in the width direction of the ceramic body 110 and may be disposed to be perpendicular to the upper and lower surfaces of the ceramic body.

For example, in the case in which the ceramic capacitor 100 according to the embodiment of the present disclosure is embedded in the board, the internal electrodes 121 and 122 may be vertically disposed.

In the case in which the internal electrodes are vertically mounted as in the embodiment of the present disclosure, for example, in the case in which the dielectric layer and the internal electrodes are stacked in the width direction in the ceramic body having the relatively reduced thickness as mentioned above, the number of stacked internal electrodes may be sufficiently increased, and resistance and inductance components may be increased in parallel with each other. Thereby, even in a case in which an area of the internal electrode is relatively small, an increase in resistance and inductance may be sufficiently cancelled, thereby decreasing equivalent series resistance (ESR) and equivalent series inductance (ESL).

In addition, an amount of regions in which the internal electrode and the external electrode contact each other is increased due to the increase in the stacking number, such that contact properties between the internal electrode and the external electrode may be improved, thereby implementing stable capacitance.

The ceramic body 110 is formed by stacking the plurality of dielectric layers 111 on each other and then sintering the stacked dielectric layers, wherein a shape and a dimension of the ceramic body 110 and the number of the stacked dielectric layers 111 are not limited to those shown in the present exemplary embodiment.

In addition, the plurality of dielectric layers 111 forming the ceramic body 110 may be in a sintered state. Adjacent dielectric layers 111 may be integrated so as to be difficult to discern a boundary therebetween without using a scanning electron microscope (SEM).

A material forming the first and second internal electrodes 121 and 122 is not particularly limited, and may be formed using a conductive paste formed of, for example, at least one of a noble metal such as palladium (Pd), a palladium-silver (Pd—Ag) alloy, and the like, nickel (Ni) and copper (Cu).

Meanwhile, the first and second internal electrodes 121 and 122, a pair of electrodes having polarities different from each other, may be formed by printing the conductive paste including a conductive metal on the dielectric layer 111 to a predetermined thickness.

Figure 4A:
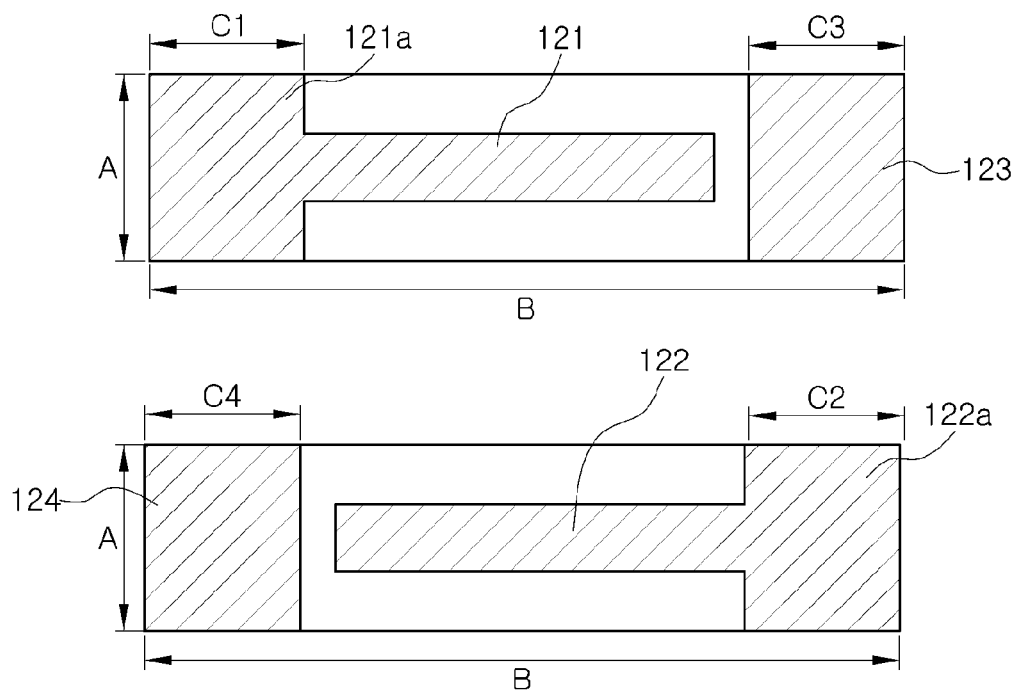
FIGS. 4A and 4B are plan views showing structures of an internal electrode and a dummy pattern of the multilayer ceramic capacitor according to the exemplary embodiment of the present disclosure.
Figure 4B:
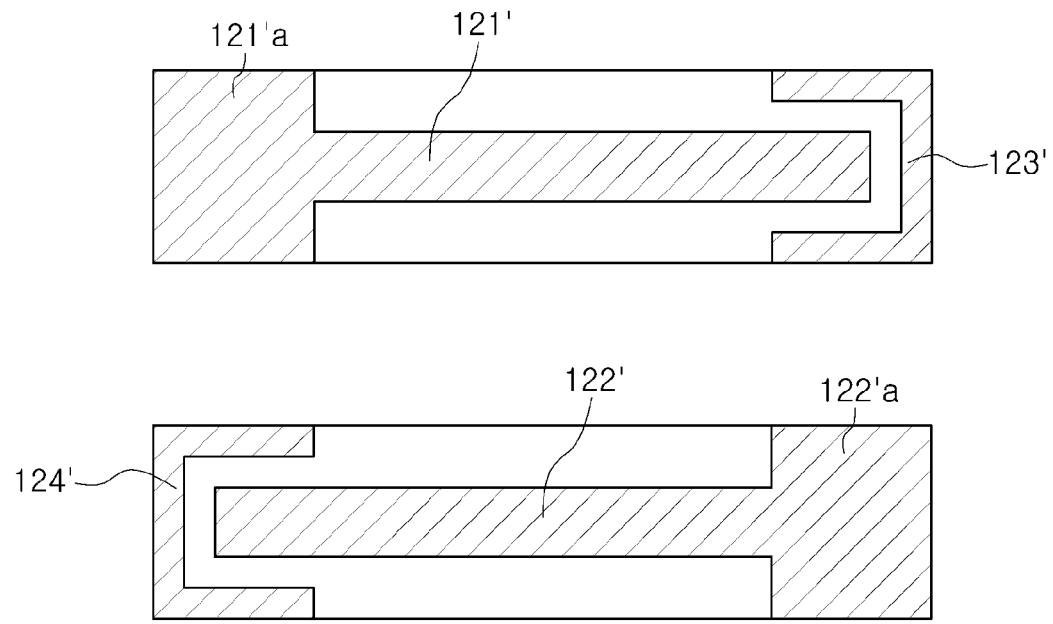

FIGS. 4A and 4B are plan views showing structures of an internal electrode and a dummy pattern of the multilayer ceramic capacitor according to the exemplary embodiment of the present disclosure.

Referring to FIG. 4A, the first and second internal electrodes 121 and 122 according to an embodiment of the present disclosure may respectively include first and second lead parts 121a and 122a extended to the upper and lower surfaces so as to be exposed thereto.

The first lead part 121a may be electrically connected to the first external electrode 131 and the second lead part 122a may be electrically connected to the second external electrode 132.

In addition, the first lead part 121a may be exposed to the upper and lower surfaces and the first end surface of the ceramic body 110 and the second lead part 122a may be exposed to the upper and lower surfaces and the second end surface of the ceramic body 110.

The first external electrode 131 may be formed to cover the first lead part 121a exposed to an outer surface of the ceramic body 110, and the second external electrode 132 may be formed to cover the second lead part 122a exposed to an outer surface of the ceramic body 110.

As shown in FIG. 4A, according to the embodiment of the present disclosure, a first dummy pattern 123 formed on the dielectric layer 111 having the first internal electrode 121 formed thereon and a second dummy pattern 124 formed on the dielectric layer 111 having the second internal electrode 122 formed thereon may be included therein.

The first dummy pattern 123 may be formed on the dielectric layer having the first internal electrode 121 formed thereon among the plurality of dielectric layers, and the second dummy pattern 124 may be formed on the dielectric layer having the second internal electrode 122 formed thereon among the plurality of dielectric layers.

For example, the first dummy pattern 123 and the first internal electrode 121 may be formed on a single surface of the dielectric layer, and the second dummy pattern 124 and the second internal electrode 122 may be formed on a single surface of the dielectric layer.

For example, the first dummy pattern 123 may be formed on a portion of a surface of the dielectric layer on which the first internal electrode 121 is formed on a portion thereof, and the second dummy pattern 124 may be formed on a portion of a surface of the dielectric layer on which the second internal electrode 122 is formed on a portion thereof.

The first dummy pattern 123 and the first internal electrode 121 may be disposed on one surface of the dielectric layer, and the second dummy pattern 124 and the second internal electrode 122 may be disposed on the other surface of the dielectric layer.

As describe above, by forming the dummy pattern and the internal electrode on the single plane, occurrence of unexpected additional capacitance due to the dummy pattern may be prevented and a process of forming the dummy pattern may be simplified. In addition, since an additional dielectric layer for forming the dummy pattern is not required, contact properties between the external electrode and the internal electrode may be improved without increasing the thickness of the multilayer ceramic capacitor.

The first dummy pattern 123 and the second dummy pattern 124 may be connected to the second external electrode 132 and the first external electrode 131 without forming the additional capacitance, respectively, thereby improve contact properties of the external electrode.

For example, the first lead part 121a of the first internal electrode and the second dummy pattern 124 may have a region overlapped with each other and may be connected to the first external electrode 131. In this case, the second dummy pattern 124 does not contribute to a capacitance formation, but may contact the first external electrode 131 to thereby serve to improve contact properties between the first lead part 121a of the first internal electrode and the first external electrode 131.

Similarly, the second lead part 122a of the second internal electrode and the first dummy pattern 123 may have a region overlapped with each other and may be connected to the second external electrode 132. The first dummy pattern 123 also does not contribute to the capacitance formation, but may contact the second external electrode 132 to thereby serve to improve contact properties between the second lead part 122a of the second internal electrode and the second external electrode 132.

In addition, since the ceramic body 110 according to the exemplary embodiment of the present disclosure includes the internal electrodes stacked in the width direction and includes a form in which the thickness thereof is less than the width, the ceramic body may have the number of the internal electrodes stacked therein in an amount greater than the number thereof in a case in which the internal electrodes are stacked in the thickness direction. Since the dummy pattern is formed on the dielectric layer having the internal electrode formed thereon, the number of the dummy patterns stacked on each other may also be increased by an increase in the number of the internal electrodes stacked on each other. Therefore, since the internal electrode and the dummy pattern are stacked in the width direction, an amount of region in which the dummy pattern and the external electrode contact each other may also be increased, thereby further improving contact properties between the internal electrode and the external electrode.

Further, the first dummy pattern 123 and the second dummy pattern 124 may decrease occurrence of a step in the stacking direction (the width direction, W direction) between the overlapped region of the first and second internal electrodes and a region having the first and second lead parts formed therein.

For example, in the case in which the first and second dummy patterns 123 and 124 are not formed, since the number of stacked internal electrodes in the region having the first and second lead parts formed therein is ½ of the number of stacked internal electrodes in the region having the first and second internal electrodes overlapped with each other, the step is generated in the width direction, a stacking direction thereof. For example, since the second lead part is not exposed to the region having the first lead part exposed thereto, and the first lead part is not exposed to the region having the second lead part exposed thereto, the step is generated.

However, according to the exemplary embodiment of the present disclosure, the first dummy pattern 123 is formed so as not to contact the first internal electrode 121 on the region to which the first lead part 121*a* is not exposed, on the dielectric layer having the first internal electrode 121 formed thereon, and the second dummy pattern 124 is formed so as not to contact the second internal electrode 122 on the region to which the second lead part 122*a* is not exposed, on the dielectric layer having the second internal electrode 122 formed thereon, such that the occurrence of the step between the region having the first and second lead parts formed thereon and the region having the first and second internal electrodes overlapped with each other may be provided, thereby providing the multilayer ceramic capacitor having high reliability.

The first dummy pattern 123 may be exposed to the upper and lower surfaces and the second end surface of the ceramic body, and the second dummy pattern 124 may be exposed to the upper and lower surfaces and the first end surface of the ceramic body.

Further, the multilayer ceramic capacitor according to the exemplary embodiment of the present disclosure may satisfy $0.1 \leq (C1+C3)/B \leq 0.6$, in the case that a length of the ceramic body 110 is B, a distance of the first lead part 121*a* exposed to the upper surface of the ceramic body is C1, and a distance of the first dummy pattern 123 exposed to the upper surface of the ceramic body 110 is C3, as shown in FIG. 4A.

In addition, the multilayer ceramic capacitor according to the exemplary embodiment of the present disclosure may satisfy $0.1 \leq (C2+C4)/B \leq 0.6$, in the case that a distance of the second lead part 122*a* exposed to the upper surface of the ceramic body 110 is C2 and a distance of the second dummy pattern 124 exposed to the upper surface of the ceramic body 110 is C4.

Since the meanings of $(C2+C4)/B$ and $(C1+C3)/B$ mentioned above are similar, the present disclosure will be described below in detail based on $(C1+C3)/B$. In the case in which there is no additional description, it may be appreciated that the description for $(C1+C3)/B$ includes the description for $(C2+C4)/B$.

In the case in which $(C1+C3)/B$ is less than 0.1, the first internal electrode (the first lead part) exposed to the upper surface of the ceramic body and an exposed part of the first dummy pattern are relatively small, such that a contact defect between the exposed first internal electrode (the first lead part), the exposed part of the first dummy pattern and the external electrode may be generated, thereby decreasing the capacitance. In addition, in the case in which the multilayer ceramic capacitor is embedded in the board, contact between the external electrode and a conductive via may not be smooth. In addition, in the case in which $(C1+C3)/B$ exceeds 0.6, a short-circuit may be caused by an interference between the first external electrode and the second external electrode.

Particularly, in the case in which $(C1+C3)/B$ exceeds 0.6, occurrence of a phenomenon (sn migration) in which electrode metal ions are eluted from the external electrode of an anode to thereby electrolytically etch the external electrodes at the time of applying the voltage to the external electrodes covering the internal electrode and the dummy pattern may be increased.

At the time of the occurrence of sn migration, the ion eluted from the external electrode of the anode may be deposited on the external electrode of a cathode as an acicular crystal, and when the acicular crystal deposited on the cathode contacts an opposite electrode (anode), a short circuit or insulation breakdown may be caused.

The first internal electrode 121 and the first dummy pattern 123 may be formed on a single surface of the same dielectric layer while having a predetermined interval therebetween. In addition, the second internal electrode 122 and the second dummy pattern 124 may be formed on a single surface of the same dielectric layer while having a predetermine interval therebetween.

A distance between the first internal electrode and the first dummy pattern and a distance between the second internal electrode and the second dummy pattern may be 20 μm to 50 μm.

In the case in which the distance between the internal electrode and the dummy pattern is less than 20 μm, the internal electrode and the dummy pattern may contact due to blurring of the internal electrode or the dummy pattern, such that an occurrence rate of the short-circuit may be significantly increased. In the case in which the distance between the internal electrode and the dummy pattern exceeds 50 μm, the overlapped area of the first and second internal electrodes may be decreased due to a decrease in the areas of the first and second internal electrodes, thereby decreasing capacitance.

In addition, according to the exemplary embodiment of the present disclosure, as shown in FIG. 4A, the first and second dummy patterns 123 and 124 may have the same shape as the first and second lead parts 121*a* and 122*a*, without contacting the first and second internal electrodes, respectively. The first and second dummy patterns 123 and 124 may be exposed to the upper and lower surfaces of the ceramic body. In this case, as shown in FIG. 4A, in the case that widths of the first and second dummy patterns are A, A may be equal to the thickness of the ceramic body.

In addition, a distance C1 that the first lead part 121*a* is exposed to the upper surface of the ceramic body in a length direction of the ceramic body and a distance C3 that the first dummy pattern 123 is exposed to the upper surface of the ceramic body in a length direction of the ceramic body may be substantially equal to each other.

A distance C2 that the second lead part 122a is exposed to the upper surface of the ceramic body in the length direction of the ceramic body and a distance C4 that the second dummy pattern 124 is exposed to the upper surface of the ceramic body in the length direction of the ceramic body may be substantially equal to each other.

In addition, a distance that the first lead part 121a is exposed to the upper surface of the ceramic body and a distance that the second lead part 122a is exposed to the upper surface of the ceramic body may be substantially equal to each other.

The first and second internal electrodes 121 and 122 may be respectively electrically connected to the first and second external electrodes 131 and 132 through the first and second lead parts 121a and 122a exposed through the end surface of the ceramic body 110. When a voltage is applied to the first and second external electrodes 131 and 132, charges are accumulated between the first and second internal electrodes 121 and 122 facing each other. In this case, the capacitance of the multilayer ceramic capacitor 100 may be proportional to an area in which the first and second internal electrodes 121 and 122 are overlapped with each other.

The first and second external electrodes 131 and 132 may be formed by applying and then sintering a conductive paste prepared by adding glass frit to the metal powder.

According to another exemplary embodiment of the present disclosure, as shown in FIG. 4B, a first dummy pattern 123' may have a form in which it encloses an end portion of a first internal electrode 121' while having a predetermined interval therebetween without contacting the first internal electrode 121'. In addition, a second dummy pattern 124' may have a form in which it encloses an end portion of a second internal electrode 122' while having a predetermined interval therebetween.

As in the present exemplary embodiment, in the case in which the first and second dummy patterns 123' and 124' each have the form enclosing the end portions of the first and second internal electrodes 121' and 122', the lengths that the first and second dummy patterns are exposed to the upper surface of the ceramic body may be secured and the overlapped area of the internal electrodes may be increased.

Board 200 Having Multilayer Ceramic Capacitor Embedded Therein

Figure 5:
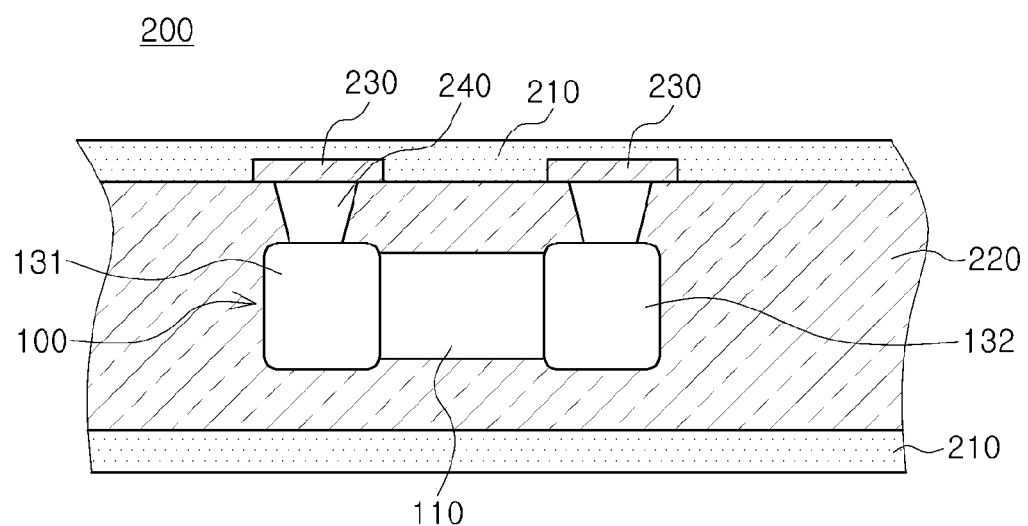
FIG. 5 is a cross-sectional view showing a board having the multilayer ceramic capacitor embedded therein according to an exemplary embodiment of the present disclosure.

FIG. 5 is a cross-sectional view schematically showing a board having a multilayer ceramic capacitor embedded therein according to an exemplary embodiment of the present disclosure.

Referring to FIG. 5, a board 200 having a multilayer ceramic capacitor embedded therein according to another exemplary embodiment of the present disclosure may include an insulation substrate 210; and a multilayer ceramic capacitor 100 including a ceramic body including a plurality of dielectric layers stacked in a width direction and having upper and lower surface opposing each other in a thickness direction, first and second side surfaces opposing each other in the width direction and first and second end surfaces opposing each other in a length direction, a first internal electrode formed on the dielectric layer in the ceramic body and including a first lead part extended so as to be exposed to the upper and lower surfaces of the ceramic body, a second internal electrode disposed to face the first internal electrode, having at least one dielectric layer of the plurality of dielectric layers therebetween and having a second lead part extended to be exposed to the upper and lower surfaces of the ceramic body, a first external electrode connected to the first internal electrode, a second external electrode connected to the second internal electrode, a first dummy pattern connected to the second external electrode, and a second dummy pattern connected to the first external electrode, and satisfying $0.1 \leq (C1+C3)/B \leq 0.6$ in the case that a length of the ceramic body is B, a distance of the first lead part is C1, and a distance of the first dummy pattern is C3.

The insulation substrate 210 may be formed by a structure having an insulation layer 220 included therein, and may include a conductive pattern 230 and a conductive via 240 configuring an interlayer circuit having various forms as shown in FIG. 5, as necessary. The above-mentioned insulation substrate 210 may be the printed circuit board 200 having the multilayer ceramic capacitor included therein.

In the case in which the multilayer ceramic capacitor 100 is embedded in the insulation substrate 210, the internal electrodes may be mounted to be perpendicular to the insulation substrate. For example, the multilayer ceramic capacitor may be disposed so that the internal electrodes included in the multilayer ceramic capacitor are perpendicular to the insulation substrate.

As described above, in the case in which the internal electrode is vertically disposed, the number of stacked internal electrodes may be sufficiently increased, such that resistance and inductance components may be increased in parallel with each other. Thereby, an increase in resistance and inductance from one internal electrode may be sufficiently cancelled, thereby decreasing ESR and ESL.

In addition, the amount of regions in which the internal electrode and the external electrode contact is increased due to the increase in the stacked amount, such that contact properties between the internal electrode and the external electrode may be improved, thereby implementing stable capacitance.

Further, since the dummy pattern is formed on a single dielectric layer on which the internal electrode is formed, the number of stacked dummy patterns may be increased by an increase in the number of stacked internal electrodes, and the amount of region in which the dummy pattern and the external electrode contact may also be increased, thereby further improving contact properties between the internal electrode and the external electrode.

Features other than the above-mentioned feature are the same as those of the multilayer ceramic capacitor according to the foregoing exemplary embodiment of the present disclosure described above. Therefore, a description thereof will be omitted.

Experimental Example

The following Table 1 shows results of testing capacitance and short-circuit occurrence of the multilayer ceramic capacitor based on (C1+C3)/B in the case that the length of the ceramic body is B, the distance of the first lead part exposed to the upper surface of the ceramic body is C1, and the distance of the first dummy pattern exposed to the upper surface of the ceramic body is C3.

In addition, in the case that the distance of the second lead part exposed to the upper surface of the ceramic body is C2 and the distance of the second dummy pattern exposed to the upper surface of the ceramic body is C4, in each experimental example, the test was performed by setting (C2+C4)/B so as to be equal to (C1+C3)/B and setting the distances that the first lead part, the second lead part, the first dummy pattern, and the second dummy pattern are exposed to the lower surface of the ceramic body so as to be equal to the distances that they are exposed to the upper surface of the ceramic body.

TABLE 1

| samples | (C1 + C3)/B | whether or not capacitance is implemented | short-circuit occurrence |
|---|---|---|---|
| 1* | 0 | X | X |
| 2* | 0.01 | X | X |
| 3* | 0.05 | X | X |
| 4 | 0.1 | ○ | X |
| 5 | 0.15 | ○ | X |
| 6 | 0.3 | ○ | X |
| 7 | 0.4 | ○ | X |
| 8 | 0.5 | ○ | X |
| 9 | 0.6 | ○ | X |
| 10* | 0.65 | X | ○ |
| 11* | 0.7 | X | ○ |
| 12* | 0.8 | X | ○ |
| 13* | 0.9 | X | ○ |

*Comparative Example
○: Capacitance of 90% or more, short-circuit occurrence
X: Capacitance less than 90%, short-circuit nonoccurrence As shown in Table 1, in samples 1 to 3 in which (C1+C3)/B is less than 0.1, a contact defect of the external electrode occurred and the capacitance was not secured (less than 90%). In samples 10 to 13, the short-circuit was caused between the external electrodes, such that the capacitance was not implemented.

As set forth above, according to exemplary embodiments of the present disclosure, the multilayer ceramic capacitor having high capacitance and not causing a short-circuit, and a board having the multilayer ceramic capacitor embedded therein may be provided.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor, comprising:
   a ceramic body including a plurality of dielectric layers stacked in a width direction and having upper and lower surface opposing each other in a thickness direction, first and second side surfaces opposing each other in the width direction, and first and second end surfaces opposing each other in a length direction;
   a first internal electrode formed on the dielectric layer in the ceramic body and including a first lead part extended to be exposed to the upper and lower surfaces of the ceramic body;
   a second internal electrode disposed to face the first internal electrode, having at least one dielectric layer of the plurality of dielectric layers therebetween and having a second lead part extended to be exposed to the upper and lower surfaces of the ceramic body;
   a first external electrode connected to the first internal electrode;
   a second external electrode connected to the second internal electrode;
   a first dummy pattern connected to the second external electrode; and
   a second dummy pattern connected to the first external electrode,
   wherein in the case that a length of the ceramic body is B, a distance of the first lead part exposed to the upper surface of the ceramic body is C1, and a distance of the first dummy pattern exposed to the upper surface of the ceramic body is C3, $0.1 \leq (C1+C3)/B \leq 0.6$ is satisfied.

2. The multilayer ceramic capacitor of claim 1, wherein in the case that a distance of the second lead part exposed to the upper surface of the ceramic body is C2 and a distance of the second dummy pattern exposed to the upper surface of the ceramic body is C4, $0.1 \leq (C2+C4)/B \leq 0.6$ is satisfied.

3. The multilayer ceramic capacitor of claim 1, wherein the first dummy pattern is formed on a dielectric layer having the first internal electrode formed thereon among the plurality of dielectric layers, and the second dummy pattern is formed on a dielectric layer having the second internal electrode formed thereon among the plurality of dielectric layers.

4. The multilayer ceramic capacitor of claim 1, wherein the first dummy pattern and the first internal electrode are disposed on one surface of the dielectric layer, and the second dummy pattern and the second internal electrode are disposed on the other surface of the dielectric layer.

5. The multilayer ceramic capacitor of claim 1, wherein the first dummy pattern has a region overlapped with the second lead part, and the second dummy pattern has a region overlapped with the first lead part.

6. The multilayer ceramic capacitor of claim 1, wherein the first lead part is exposed to the upper and lower surfaces and the first end surface of the ceramic body.

7. The multilayer ceramic capacitor of claim 1, wherein the second lead part is exposed to the upper and lower surfaces and the second end surface of the ceramic body.

8. The multilayer ceramic capacitor of claim 1, wherein the first dummy pattern is exposed to the upper and lower surfaces and the second end surface of the ceramic body.

9. The multilayer ceramic capacitor of claim 1, wherein the second dummy pattern is exposed to the upper and lower surfaces and the first end surface of the ceramic body.

10. The multilayer ceramic capacitor of claim 1, wherein the first dummy pattern is formed to enclose an end portion of the first internal electrode opposing the first dummy pattern while having a predetermined interval therebetween.

11. The multilayer ceramic capacitor of claim 1, wherein the ceramic body has a thickness less than a width and a length.

12. The multilayer ceramic capacitor of claim 1, wherein the first internal electrode and the second internal electrode are disposed so as to be perpendicular to the upper and lower surfaces of the ceramic body.

13. The multilayer ceramic capacitor of claim 1, wherein the first internal electrode and the second internal electrode are disposed to be perpendicular to a board when being embedded in the board.

14. A board having a multilayer ceramic capacitor embedded therein, comprising:
   an insulation substrate; and
   a multilayer ceramic capacitor including a ceramic body including a plurality of dielectric layers stacked in a width direction and having upper and lower surfaces opposing each other in a thickness direction, first and second side surfaces opposing each other in the width direction and first and second end surfaces opposing each other in a length direction, a first internal electrode formed on the dielectric layer in the ceramic body and including a first lead part extended to be exposed to the upper and lower surfaces of the ceramic body, a second internal electrode disposed to face the first internal electrode, having at least one dielectric layer of the plurality of dielectric layers therebetween and having a second lead part extended to be exposed to the upper and lower surfaces of the ceramic body, a first external electrode connected to the first internal electrode, a second external electrode connected to the second internal electrode, a first dummy pattern connected to the second external electrode, and a second dummy pattern connected to the first external electrode, and satisfying $0.1 \leq (C1+C3)/B \leq 0.6$ in the case that a length of the ceramic body is B, a distance of the first lead part is C1, and a distance of the first dummy pattern is C3.

15. The board having a multilayer ceramic capacitor embedded therein of claim 14, wherein the first internal electrode and the second internal electrode are disposed so as to be perpendicular to the insulation substrate.

* * * * *